(12) United States Patent
Li et al.

(10) Patent No.: US 10,833,232 B2
(45) Date of Patent: Nov. 10, 2020

(54) LED DEVICE

(71) Applicant: XIAMEN SANAN OPTOELECTRONICS TECHNOLOGY CO., LTD., Xiamen (CN)

(72) Inventors: Xing-Long Li, Xiamen (CN); Chi-Wei Liao, Xiamen (CN); Chen-Ke Hsu, Xiamen (CN); Weng Tack Wong, Xiamen (CN)

(73) Assignee: XIAMENC SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 69 days.

(21) Appl. No.: 16/147,784

(22) Filed: Sep. 30, 2018

(65) Prior Publication Data

US 2019/0051799 A1 Feb. 14, 2019

Related U.S. Application Data

(63) Continuation of application No. PCT/CN2017/108001, filed on Oct. 27, 2017.

(30) Foreign Application Priority Data

Aug. 8, 2017 (CN) .................... 2017 2 0981913 U
Nov. 20, 2017 (CN) .................... 2017 2 1553252 U
(Continued)

(51) Int. Cl.
*H01L 33/58* (2010.01)
*H01L 33/48* (2010.01)
(Continued)

(52) U.S. Cl.
CPC ................ *H01L 33/58* (2013.01); *F21V 5/04* (2013.01); *H01L 33/486* (2013.01); *H01L 33/62* (2013.01);
(Continued)

(58) Field of Classification Search
CPC ...... H01L 33/58; H01L 33/60; F21V 2115/10; F21V 2115/15; G02B 19/0061; G02B 19/0066; G02B 19/0028
See application file for complete search history.

(56) References Cited

U.S. PATENT DOCUMENTS 7,740,382 B2 * 6/2010 Chen .................. G02B 27/0994
313/498
9,012,950 B2 * 4/2015 Choi ..................... H01L 33/486
257/79
(Continued)

FOREIGN PATENT DOCUMENTS

CN 102644855 A 8/2012
CN 104132305 A 11/2014
WO 0024062 A1 4/2000

*Primary Examiner* — Eric A. Ward
(74) *Attorney, Agent, or Firm* — Syncoda LLC; Feng Ma

(57) ABSTRACT

A light-emitting diode (LED) includes: a base having an upward-opening accommodating space; an LED chip disposed at the base, and arranged in the accommodating space; a packaging adhesive covering the LED chip; a lens disposed over the packaging adhesive, wherein: the lens has a first surface proximal to the packaging adhesive; the first surface has: a first subsurface at a center area with a substantially spherical or parabolic shape; a second subsurface with a substantially ring shape and surrounding the first subsurface and extending downward with an increasing diameter; a third subsurface with a substantially ring shape and surrounding the second subsurface, having a top ring edge and extending downward with a decreasing diameter; and a fourth subsurface with a substantially planar shape and
(Continued)

surrounding the top ring edge of the third subsurface and connected with the base.

9 Claims, 8 Drawing Sheets

(30) Foreign Application Priority Data

Nov. 20, 2017 (CN) .................... 2017 2 1553972 U
Dec. 29, 2017 (TW) ............................ 106219499 U
Feb. 2, 2018 (TW) ............................ 107201664 U

(51) Int. Cl.
    *H01L 33/62*     (2010.01)
    *F21V 5/04*     (2006.01)
    *H01L 33/56*     (2010.01)
    *F21Y 115/10*     (2016.01)
    *H01L 33/60*     (2010.01)

(52) U.S. Cl.
    CPC ........... *F21Y 2115/10* (2016.08); *H01L 33/56* (2013.01); *H01L 33/60* (2013.01); *H01L 2933/0083* (2013.01)

(56) References Cited

U.S. PATENT DOCUMENTS

| | | | |
|---|---|---|---|
| 9,299,904 B2 | 3/2016 | Tamaki et al. | |
| 2013/0141920 A1* | 6/2013 | Emerson | H01L 33/486 362/311.01 |
| 2013/0270594 A1* | 10/2013 | Cai | H01L 33/48 257/98 |
| 2015/0316228 A1* | 11/2015 | Saito | F21V 5/045 362/311.06 |
| 2016/0170121 A1* | 6/2016 | Guiset | G02B 19/0047 362/554 |
| 2018/0006202 A1* | 1/2018 | Kim | H01L 33/58 |
| 2018/0026167 A1* | 1/2018 | Eckert | H01L 33/60 257/98 |
| 2019/0051799 A1 | 2/2019 | Li et al. | |

* cited by examiner

The included angle between the light direction and the optical axis direction

The included angle between the light direction and the optical axis direction

LED DEVICE

CROSS-REFERENCE TO RELATED APPLICATIONS

The present application is a continuation of, and claims priority to, PCT/CN2017/108001 filed on Oct. 27, 2017, which claims priority to Chinese Patent Application No. 201720981913.5 filed on Aug. 8, 2017. The present application also claims priority to Chinese Patent Application Nos. 201721553252.2 and 201721553972.9, both filed on Nov. 20, 2017, TW106219499 filed on Dec. 29, 2017, and TW107201664 filed on Feb. 2, 2018. The disclosures of these applications are hereby incorporated by reference in their entirety.

BACKGROUND

With reference to FIG. 1, similar light-emitting diode (LED) device are being employed in more and more fields. As required by one application, the LED device provides intense and non-divergent light. A known LED device 1 emitting small-light-emitting angle is provided, which meets conditions below: Assume that the optical-axis light L11 moving along the optical axis direction D11 of the known LED device 1 has maximum light intensity, and take 100% light intensity of the optical-axis light L11 as the basis. When light intensity of the deviating light L12 that deviates from the optical axis direction D11 is reduced to 50%, the light-emitting angle A11 between the light direction D12 of each deviating light L12 and the optical axis direction D11 must be less than or equal to 25 degrees ($\theta_{1/2} \leq \pm 25$).

With reference to FIG. 2, the known LED device 1 comprises a base 11, a LED chip 12 that generates light on the base 11, a reflective cavity body 13 on the base 11 that surrounds the LED chip 12 and defines a reflective cavity 131 accommodating the LED chip 12, and a lens 14 in the reflective cavity body 13 that seals the reflective cavity 131 and is separated from the LED chip 12. The reflective cavity body 13 has a reflective surface 132 that defines a near-bowl-shaped reflective cavity 131. The lens 14 has a first surface 141 that orients to the LED chip 12 and appears spherical bend, and a second surface 142 opposite to the first surface 141, the section of which appears serrated shape.

This known LED device 1 provides small light-emitting angle light mainly by reflecting the light emitted by the LED chip 12 through the reflective surface 132 and then refracted by the lens 14. However, in addition to high cost of the reflective cavity body 13, the usage of the reflective cavity body 13 also improves package difficulty of the known LED device 1 and increases production cost. To further narrow the light-emitting angle A11 as required during usage, an existing practice is to increase height H0 of the reflective cavity body 13, which may result in overlarge size of the LED device 1 and limits applications. In addition, this known LED device 1 generates intense stray light that influences other optical components and causes optical interference for other optical components.

SUMMARY

Various embodiments of the present disclosure provide an LED device that provides small light-emitting angle light without derivative problems due to the usage of the reflective cavity body or optical interference for other light optical components, which can overcome at least one defect of the prior art.

The LED device includes a base, an LED chip, a packaging adhesive, and a lens.

The base defines an upward-opening accommodating space. The LED chip is disposed on the base, and arranged in the accommodating space. The packaging adhesive covers the LED chip. The lens is disposed on the base above the packaging adhesive, which comprises a first surface towards the packaging adhesive. The first surface has a first subsurface that essentially appears spherical or parabolic bend at the center, a ring-surface second subsurface that surrounds the first subsurface and extends from up to bottom with increasing diameter, a ring-surface third subsurface with a top ring edge that surrounds the second subsurface and extends from up to bottom with decreasing diameter, and a plane fourth subsurface that surrounds the top ring edge of the third subsurface and connects the base.

The LED device can have one or more of the following advantages. Light generated by the LED chip is emitted from the second subsurface, and the third subsurface can replace the reflective cavity in prior art for reflection, so that the LED device can emit small light-emitting angle light without using a special-structure reflective cavity, and is free of derivative problems due to the usage of the reflective cavity body.

Various embodiments of the present disclosure also provide an LED device capable for overcoming at least one defect of the prior art.

The LED device comprises a base, a LED chip, a packaging adhesive, and a lens.

The base comprises a base, and an encircling base portion that extends upwards from the base and defines an upward-opening accommodating space together with the base. The encircling base portion has an inner surface towards the inner side, and an outer surface towards the outer side. The inner surface and the outer surface are light-absorbing surfaces, light-diffusing surfaces, or their combination. The LED chip is disposed on the base, and arranged in the accommodating space. The packaging adhesive covers the LED chip. The lens is disposed on the base above the packaging adhesive.

The LED device has the following advantages: The inner surface and the outer surface are light-absorbing surfaces or light-diffusing surfaces, which absorb or diffuse generated stray light, thus reducing optical interference for other light optical components.

The present invention is to disclose a LED device capable for overcoming at least one defect of the prior art.

The LED device comprises a base, a LED chip, a packaging adhesive, and a lens.

The base defines an upward-opening accommodating space. The LED chip is disposed on the base, and arranged in the accommodating space. The packaging adhesive covers the LED chip. The lens is disposed on the base above the packaging adhesive, which comprises a first surface towards the packaging adhesive. The first surface has a first subsurface that essentially appears spherical or parabolic bend at the center, a ring-surface second subsurface that surrounds the first subsurface and extends from up to bottom with increasing diameter, a ring-surface third subsurface that surrounds the second subsurface and extends from up to bottom with decreasing diameter, and a ring-shape fourth subsurface with horizontal extension that connects to the bottom ends of the second subsurface and the third subsurface.

The LED device has the following advantages: Light generated by the LED chip is emitted from the second subsurface, and the third subsurface can replace the reflective cavity in prior art for reflection, so that the LED device can emit small light-emitting angle light without using a special-structure reflective cavity, and is free of derivative problems due to the usage of the reflective cavity body.

The present invention is to disclose a LED device capable for overcoming at least one defect of the prior art.

The LED device comprises a base, a LED chip, a packaging adhesive, and a lens.

The base comprises a base, and an encircling base portion that extends upwards from the base and defines an upward-opening accommodating space together with the base. The encircling base portion has an inner surface towards the inner side, and an outer surface towards the outer side. The encircling base portion also has a top surface for arranging the lens, where, surface roughness of the top surface is larger than that of the inner surface and the outer surface.

In some embodiments, the third subsurface further has:

a stretch-out surface portion formed by a straight-downward extension of the top ring edge; and a radial-shrinkage surface portion formed by a downward-extension of the stretch-out surface portion with a decreasing diameter.

In some embodiments, a horizontal spacing between the top ring edge of the third subsurface and the base is more than 0 mm but not more than 0.3 mm.

In some embodiments, the LED chip has a chip size;

the first subsurface of the lens has an optical axis; and a spacing between the optical axis and the ring top edge of the third subsurface is about 1.6~3.4 times of the chip size.

In some embodiments, a maximum surface spacing between the upper top surface of the LED chip and the upper surface of the packaging adhesive is 0.1 mm~0.5 mm.

In some embodiments, the first subsurface and the packaging adhesive are separated up and down.

In some embodiments, the base includes: a bottom base portion configured to have the LED chip disposed thereon; and an encircling base portion extending upwards along the bottom base portion higher than the LED chip and surrounding the LED chip; the LED chip has a chip size, and an upward or downward spacing between a horizontally-extending surface of the upper top surface of the LED chip and a top surface of the encircling base portion is at least 0.7 times of the chip size.

In some embodiments, the first subsurface and the second subsurface are light emitting surfaces and the third subsurface is a light reflective surface.

In some embodiments, the lens also has a second surface opposing the first surface;

the second surface comprises:

a plurality of straight surface portions that extend straight up and down; and a plurality of inclined surface portions that extend obliquely up and down, wherein each inclined surface portion is connected between two adjacent straight surface portions.

In some embodiments, the lens also comprises a second surface opposing the first surface; and the second surface is a plane.

In some embodiments, a refractive index of the LED chip is 1.6~4.

In some embodiments, a refractive index of the packaging adhesive is 1.3~1.6.

In some embodiments, a refractive index of the lens is 1.3~1.7.

In some embodiments, the base comprises a base for disposing the LED chip, and an encircling base portion higher than the LED chip that extends upwards along the base and surrounds the LED chip, and the base and the encircling base portion are all-in-one piece or not all-in-one piece.

In some embodiments, each of the inner surface and the outer surface is a light-absorbing surface, or a combination of light-absorbing surface and light-diffusing surface, with a light absorption rate not less than 70%.

In some embodiments, each of the inner surface and the outer surface is a light-absorbing surface is defined by an object made of a black material comprising at least one of a black metallic oxide or a black high molecular material; the black high molecular material comprises at least one of an epoxy molding compound, polyphthalamide, poly1, 4-cyclohexylene dimethylene terephthalate, or silicone molding compound doped with black $SiO_2$ and black $TiO_2$.

In some embodiments, the encircling base portion also has a top surface configured to arrange the lens; and a roughness of the top surface is larger than that of the inner surface and the outer surface.

In some embodiments, the roughness of the top surface is 3 μm~15 μm.

In some embodiments, the roughness of the top surface is 1 μm~10 μm.

In some embodiments, the lens has a first surface towards the packaging adhesive;

the first surface has:

a first subsurface that essentially appears spherical or parabolic bend at a center;

a ring-surface second subsurface that surrounds the first subsurface and extends upwards with an increasing diameter;

a ring-surface third subsurface with a top ring edge that surrounds the second subsurface and extends downwards with a decreasing diameter; and a planar fourth subsurface that surrounds the top ring edge of the third subsurface and connects the base.

In some embodiments, the lens also has a second surface opposite to the first surface, in which, the second surface comprises a plurality of straight surface portions that extend straightly up and down and a plurality of inclined surface portions that extend obliquely up and down, and each inclined surface portion is connected between two adjacent straight surface portions.

In some embodiments, the lens also comprises a second surface opposite to the first surface, and the second surface is a plane.

In some embodiments, the packaging adhesive has a protrusion-shaped or plane-shaped upper surface.

In another aspect, an LED device is provided, including:
a) a base that defines an upward-opening accommodating space;

a LED chip disposed on the base, and arranged in the accommodating space;

a packaging adhesive covering the LED chip;

a lens disposed on the base above the packaging adhesive, which comprises a first surface towards the packaging adhesive, wherein, the first surface has a first subsurface that essentially appears spherical or parabolic bend at the center, a ring-surface second subsurface that surrounds the first subsurface and extends from up to bottom with increasing diameter, a ring-surface third subsurface that surrounds the second subsurface and extends from up to bottom with decreasing diameter, and a ring-shape fifth subsurface with horizontal extension that connects to the bottom ends of the second subsurface and the third subsurface.

In some embodiments, the lens also comprises a second surface opposite to the first surface, in which, the second surface comprises a plurality of straight surface portions that extend straightly up and down and a plurality of inclined surface portions that extend obliquely up and down, and each inclined surface portion is connected between two adjacent straight surface portions.

In some embodiments, the lens also comprises a second surface opposite to the first surface, and the second surface is a plane with horizontal expansion.

In some embodiments, the face width of the second surface is 2.5~4 mm.

In some embodiments, a maximum outer ring width of the third subsurface is 1.5~3.5 mm.

In some embodiments, the maximum ring width of the second subsurface is 0.8~2 mm.

In some embodiments, the base comprises a base with horizontal extension and an encircling base portion extends upwards from the base, and the base and the baffle define an accommodating space.

In some embodiments, the base also comprises an encircling dam which is disposed on the base and surrounds the LED chip.

In some embodiments, the base is 1-2 mm high the base also has a coating layer coated in an inner surface of the encircling base portion, and the coating layer is a Bragg reflective layer, a metal reflective layer or an omnidirectional reflective layer.

In some embodiments, the packaging adhesive has an upward-protrusion-shaped or plane-shaped upper surface.

In some embodiments, the refractive index of the packaging adhesive is 1.3~1.6.

The LED device can have one or more of the following advantages:

roughness of the contact surface between the baffle structure and the lens is increased to eliminate and decrease stray light and avoid optical interference for other adjacent modules during usage. Thus, the lens sealing process becomes more stable and is not prone to slip, making lens fixing position accurate and improving production and operation efficiency.

BRIEF DESCRIPTION OF THE DRAWINGS

Other features and advantages of the present invention will be illustrated in embodiments below with reference to figures.

Figure 1:
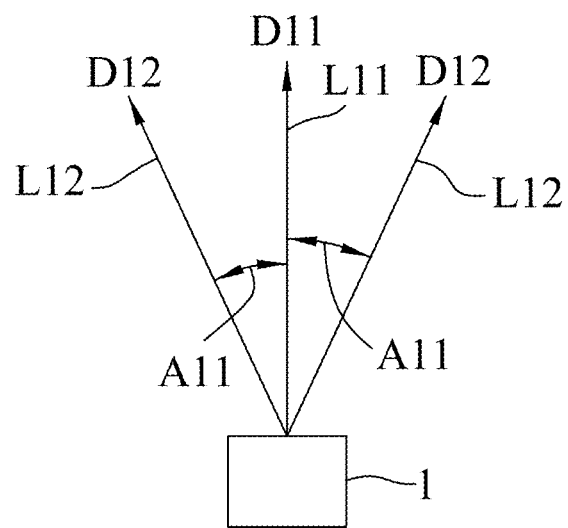
FIG. 1 is a schematic diagram, showing how a light-emitting angle is defined in a known LED device.
Figure 2:
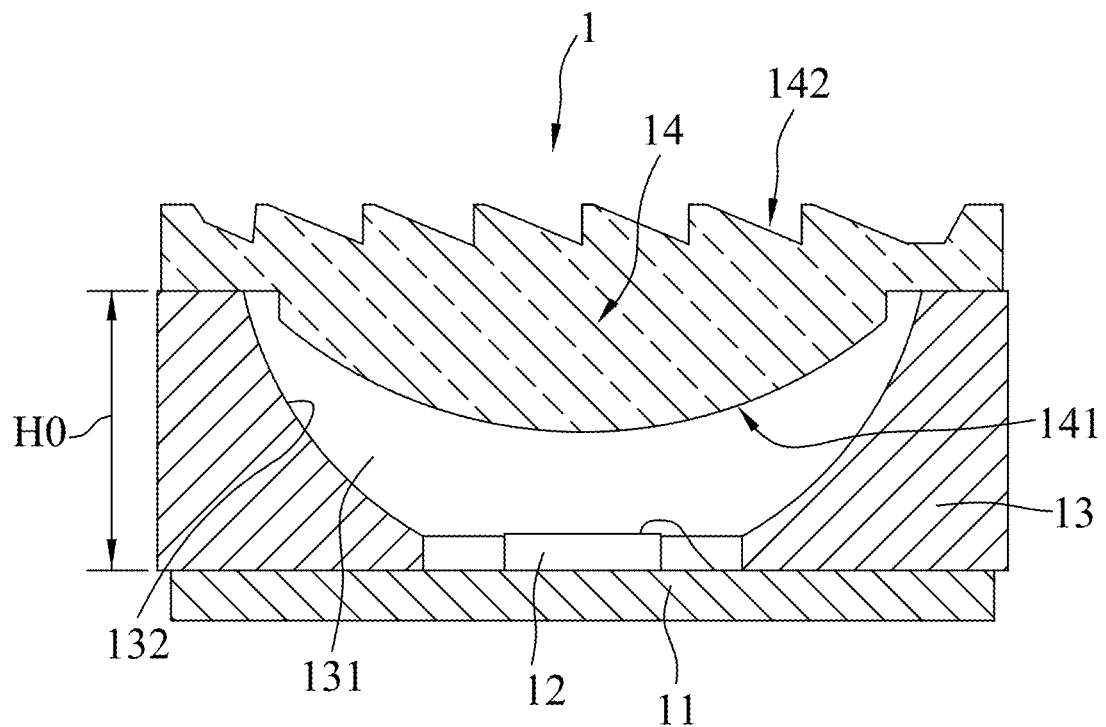
FIG. 2 is an incomplete section view, showing the known LED device.
Figure 3:
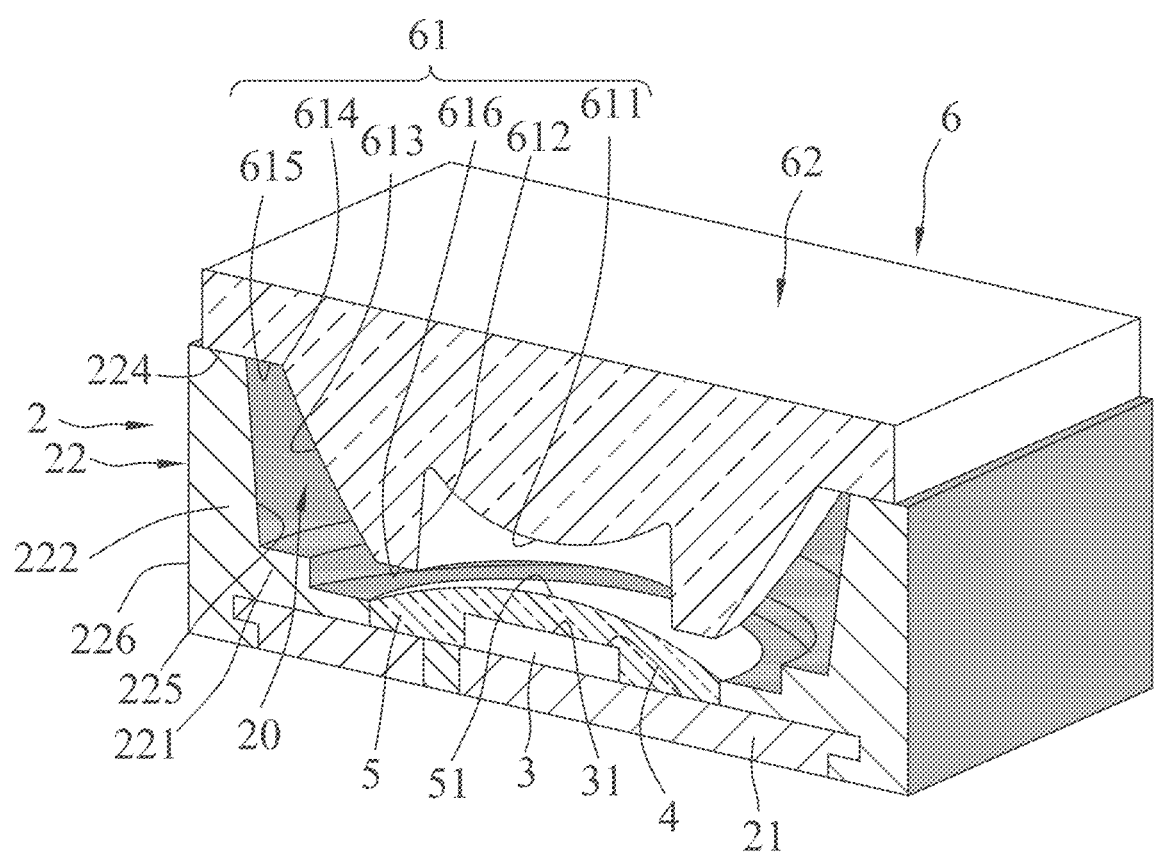
FIG. 3 is an incomplete 3D spatial diagram, showing a first embodiment of the LED device according to the present disclosure.
Figure 4:
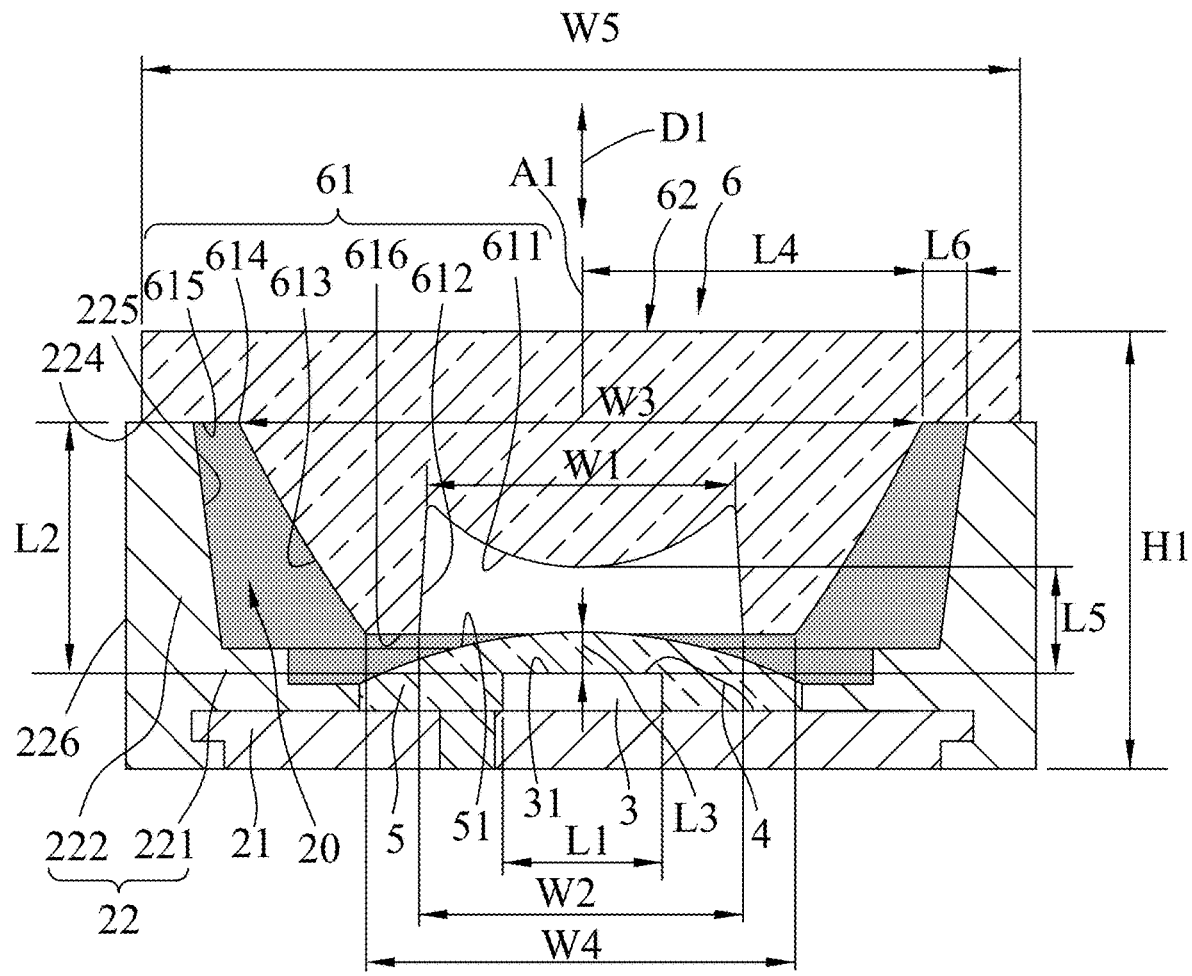
FIG. 4 is an incomplete sectional view showing the first embodiment.

In the drawings:
2 Base
20 Accommodating space
21 Base
22 Encircling base portion
221 Encircling wall portion
222 Straight wall portion
224 Top surface
225 Inner surface
226 Outer surface
25 Encircling dam
3 LED chip
31 Upper top surface
4 Gold wire
5 Packaging adhesive
51 Upper surface
6 Lens
61 First surface
611 First subsurface
612 Second subsurface
613 Third subsurface
614 Top ring edge
615 Fourth subsurface
616 Fifth subsurface
617 Stretch-out surface portion
618 Radial-shrinkage surface portion
62 Second surface
621 Encircling surface segment
622 Circular surface segment
623 Straight surface portion
624 Inclined surface portion
A1 Optical axis
A21 Obtuse angle
A22 Strong light angle
A23 Semi light angle
D1 Optical axis direction
H1 Height
L1 Chip size
L2 Up-and-down spacing
L3 Maximum surface spacing
L4 Spacing distance
L5 Shortest straight-direction spacing
L6 Horizontal spacing
L7 Small-angle light
L8 Large-angle light
W1 Minimum ring width
W2 Maximum ring width
W3 Outer ring width
W4 Maximum diameter width
W5 Face width.

DETAILED DESCRIPTION

Similar components shall bear the same numbering throughout the description below.

With reference to FIGS. 3 to 6, an embodiment of the LED device according to the present invention comprises a base 2, a LED chip 3 disposed on the base 2, a gold wire 4 that connects the LED chip 3 and the circuit which is not shown, a packaging adhesive 5 wrapping the LED chip 3 and the gold wire 4, and a lens covering the base 2.

The base 2 comprises a near-square base 21 with horizontal expansion, and an encircling base portion (also referred to an encircling base portion) 22 that is embedded in the base 21 and extends upwards around the base 21.

The base 2 composed of the base 21 and the encircling base portion 22 has a height H1 of 1 mm~2 mm, and the base 21 in this first embodiment is made of metal materials with good thermal conduction for heat dissipation, the surface of which is gold-plated. However, in other embodiments of the present invention, the base 21 can be fabricated by ceramics, plastics, glass or composite material from the aforesaid material and metal.

The encircling base portion 22 is mainly made of black high molecular material and defines an accommodating space 20 together with the base 21, which comprises a ring-shaped encircling wall portion 221 that embeds the base 21 and surrounds the LED chip 3, and a straight wall portion 222 that expends upwards along the encircling wall portion 221. In this embodiment, the black high molecular material is epoxy molding compound (EMC) doped with black $SiO_2$ and black $TiO_2$. However, in other embodiments of the present invention, the black high molecular material can be polyphthalamide (PPA), poly1, 4-cyclohexylene dimethylene terephthalate (PCT), silicone molding compound (SMC) doped with black $SiO_2$ and black $TiO_2$ or any of their combination.

The encircling wall portion 221 and the straight wall portion 222 define a light-absorbing inner surface 225 that orients the inner side and the LED chip 3, and an outer surface 226 at outer side that orients the outer side. As the encircling base portion 22 is made of EMC doped with black material, light absorption rate of the inner surface 225 and the outer surface 226 can be more than 70%. The straight wall portion 222 has a top surface 224 at top with square exterior portion and round interior portion.

According to other embodiments of the present invention, a coating layer can be disposed between the inner surface 225 and the outer surface 226. The coating layer and the encircling base portion 22 can be made of black high molecular material as previously mentioned, and can be made of black metallic oxide, or the combination of black high molecular material and black metallic oxide. The coating layer can be a Bragg reflective layer, a metal reflective layer or an omnidirectional reflective layer.

The LED chip 3, sized 30 mil×30 mil (mil: micro-inch) is disposed on the base 21, and placed in the encircling wall portion 221 of the encircling base portion 22, which emits infrared light. As general knowledge, the structural technology of the LED chip 3 is not described further. The LED chip 3 defines a chip size L1 (side length in this embodiment, which can be the diagonal length of the LED chip 3 according to other embodiments), and has an upward upper top surface 31. Taking vacuum refractive index 1 as the basis, refractive index of the LED chip 3 is 3.2, or can be 1.6-4. The up-and-down spacing L2 between the horizontal-extending surface of the upper top surface 31 and the top surface 224 of the encircling base portion 22 is at least 0.7 times of the chip size L1. In addition, those with general knowledge should understand that, based on different application fields of the first embodiment, the LED chip 3 can emit light with different wavelengths and is not restricted to infrared light.

The packaging adhesive 5, made of silicone (silica gel) or epoxy resin, wraps the LED chip 3 and improves light emitting efficiency of the LED chip 3. Take the vacuum refractive index 1 as the basis, refractive index of the packaging adhesive 5 is 1.45, which can be 1.3-1.6 according to other embodiments of the present invention. The packaging adhesive 5 has an upper surface 51 with arc-protrusion towards the lens 6. The maximum surface spacing L3 between the upper surface 51 and the upper top surface 31 of the LED chip 3 is 0.3 mm. According to other embodiments of the present invention, the maximum surface spacing L3 can be 0.1~0.5 mm.

The lens 6, with refractive index of 1.41, comprises a first surface 61 towards the packaging adhesive 5, and an upward and plane second surface 62 that is opposite to the first surface 61. According to other embodiments of the present invention, refractive index of the lens 6 can be 1.3~1.7.

The first surface 61 comprises a first subsurface 611 that essentially appears sphere at the center, a ring-surface second subsurface 612 that surrounds the first subsurface 611 and extends from up to bottom with increasing diameter from the first subsurface 611, a ring-surface third subsurface 613 that surrounds the second subsurface 612 and extends from up to bottom with decreasing diameter, a plane-ring-shaped fourth subsurface 615 that horizontally extends outwards from the top ring edge 614 of the third subsurface 613, and connects to the top surface 224 of the base 2, and a ring-shaped fifth subsurface 616 that horizontally extends and connects between the bottom ends of the second subsurface 612 and the third subsurface 613.

The first subsurface 611 and the packaging adhesive 5 are up-and-down separated and protrude downwards with curvature of 1.2 mm. According to other embodiments of the present invention, the curvature of the first subsurface 611 can be 0.5 mm-3 mm, or the first subsurface can be a paraboloid like a rotary paraboloid or an elliptic paraboloid. The first subsurface 611 defines an up-and-bottom extending optical axis A1, and an extending optical axis direction D1 of the optical axis A1. As general knowledge in the optical field, the definition method of the optical axis A1 and the optical axis direction D1 is not additionally described below. Those with general knowledge should understand that the optical axis direction D1 varies based on the placement direction of first embodiment, and is not restricted to the up-and-down direction as shown in the figure.

The top ring edge 614 between the optical axis A1 and the third subsurface 613 defines a spacing distance L4. The spacing distance L4 is 2.5 times of the chip size L1 of the LED chip 3. According to other embodiments of the present invention, the spacing distance L4 can be 1.6-3.4 times of the chip size L1. The shortest straight-direction spacing L5 between the first subsurface 611 and the upper top surface 31 of the LED chip 3 is not more than the up-and-down spacing L2 defined by the upper top surface 31 and the top surface 224, and not more than two times of the chip size L1 of the LED chip 3.

The minimum ring width W1 defined by the top edge of the second subsurface 612 is 0.5 mm, and the maximum ring width W2 defined by the bottom edge of the second subsurface 612 is 2 mm.

The third subsurface 613 and the second subsurface 612 are internally and externally separated from each other at radical direction, and the horizontal spacing L6 of the top ring edge 614 of the third subsurface 613 and the top surface 224 of the base 2 is 0.05 mm, and the maximum outer ring width W3 defined by the top ring edge 614 is 3.5 mm. According to other embodiments of the present invention, the horizontal spacing L6 can be more than 0 mm, but not more than 0.3 mm.

The fourth subsurface 615 is a ring shape where the exterior portion is square and the interior portion is round, and the inner edge of the ring connects the top ring edge 614 of the third subsurface 613. The fifth subsurface 616 appears a circular ring, where, the inner edge of the ring connects the bottom of the second subsurface 612, and the outer edge of the ring connects the bottom of the third subsurface 613, and the maximum diameter width W4 defined by the outer edge of the ring of the fifth subsurface 616 is 2.5 mm.

According to other embodiments of the present invention, the minimum ring width W1 can be 0.5 mm-2 mm; the maximum ring width W2 can be 0.8 mm-2 mm; the maximum outer ring width W3 can be 1.5 mm-3.5 mm; and the maximum diameter width W4 can be 1 mm-2.5 mm.

Figure 5:
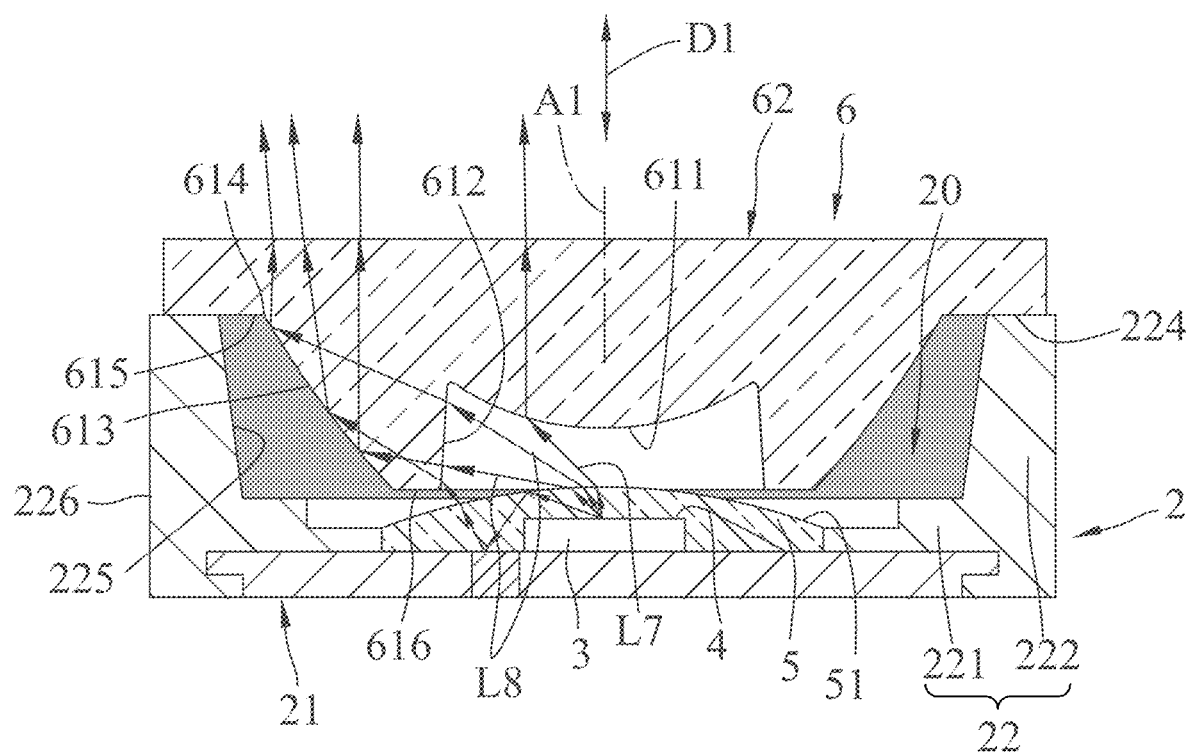
FIG. 5 is an incomplete section view, showing the movement path of light generated from the LED chip according to the first embodiment.

In this first embodiment, the light emitted from the LED chip 3 can be divided into small-angle light L7 with small angle between the light direction and the optical axis direction D1 (with reference to FIG. 5), and large-angle light L8 with large angle between the light direction and the optical axis direction D1 (with reference to FIG. 5). The small-angle light L7 undergoes the first refraction when emitting into the first subsurface 611, where the light direction is deflected basically same as the optical axis direction D1, and then emitted by the second surface 62. The large-angle light L8 is emitted from the second subsurface 612 and undergoes the first refraction. The refracted large-angle light L8 is then reflected by the third subsurface 613 so that the light direction is corrected towards the optical axis direction D1, and finally emitted by the second surface 62.

Figure 6:
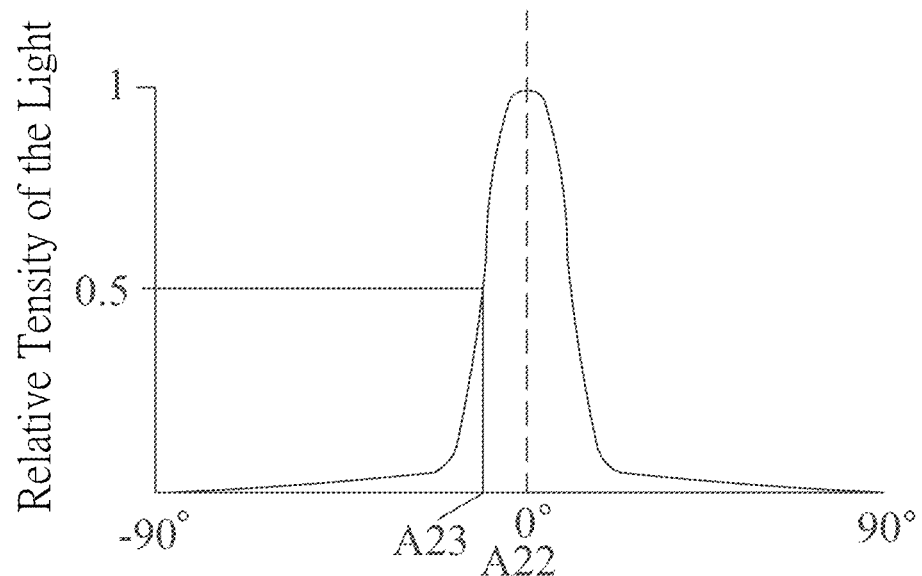
FIG. 6 is a graph illustrating the light moving along different directions in the first embodiment, relative intensity of the light, and the included angle between the light direction and the optical axis direction.

As shown in FIG. 6, the light direction of the light with strongest intensity according to the first embodiment and the optical axis direction D1 form a strong light angle A22($\theta_A$), and the half-intensity light direction and the optical axis direction D1 form a semi light angle A23($\theta_{1/2}$). As the second surface 62 is a plane, the strong-light angle A22 is 0 degree.

The horizontal spacing L6 of the top ring edge 614 of the third subsurface 613 and the top surface 224 of the base 2 is more than 0 mm but not more than 0.3 mm. Thus, the lens 6 can fill the accommodating space 20 to the maximum, and utilize the inner size of the package body of the LED chip 3 to the maximum extent. In addition, a large-size lens 6 can be used, making the lens 6 easier to be positioned by the encircling base portion 22, which facilitates light entry and improves light utilization rate.

The spacing distance L4 defined by the optical axis A1 of the first subsurface 611 and the top ring edge 614 of the third subsurface 613 is 1.6~3.4 times of the chip size L1 of the LED chip 3. The opening of the lens 6 is designed large, namely, the area surrounded by the top ring edge 614 is large to improve light extraction efficiency of the lens 6.

The larger is the maximum surface spacing L3 between the upper top surface 31 of the LED chip 3 and the upper surface 51 of the packaging adhesive 5, the higher is the light extraction efficiency of the lens 6, and the smaller is the light extraction angle. When the maximum surface spacing L3 is 0.1~0.5 mm, a balance is achieved between light extraction efficiency improvement and decrease of light extraction angle. This improves external quantum efficiency for the package of the LED chip 3 and causes less influence on decrease of light extraction angle.

The up-and-down spacing between the first subsurface 611 and the packaging adhesive 5 leaves space for the production process of the first embodiment and prevents the lens 6 from contacting the packaging adhesive 5, making it easier for manufacturing and achieves a higher light-emitting efficiency of the lens 6.

The up-and-down spacing L2 of the horizontal-extending surface of the upper top surface 31 and the top surface 224 of the encircling base portion 22 is at least 0.7 times of the chip size L1 of the LED chip 3, which defines the area of the third subsurface 613 and the inclining and extending angle, thus increasing total area of effective reflection of the first surface 61 and narrowing light extraction angle of the light emitting component.

The shortest straight-direction spacing L5 between the first subsurface 611 and the upper top surface 31 of the LED chip 3 is not more than the up-and-down spacing L2 defined by the upper top surface 31 and the upper surface 51, and is not more than two times of the chip size L1 of the LED chip 3. Thus, vertical size of the lens 6 is restricted and horizontal size is further controlled while the small angle is achieved, thus decreasing the package body size.

Given the refractive index of the LED chip 3, the packaging adhesive 5 and the lens 6, which is 3.2, 1.45 and 1.41 respectively, during movement, light produced by the LED chip 3 will pass through materials with high, medium and low refractive index in sequence, which improves external quantum efficiency of the first embodiment and narrows the light-emitting angle of the first embodiment.

To sum up, the reflective cavity in prior art is replaced by the third subsurface 613 according to the first embodiment for reflection. Therefore, when a LED chip 3 of same size is utilized, the overall size is decreased to below 70% of the size of an existing LED device, achieving wider fields of application. In addition, the first embodiment can make the light source sensor more accurate and flexible thanks to smaller light-emitting angle and more intense light.

Figure 7:
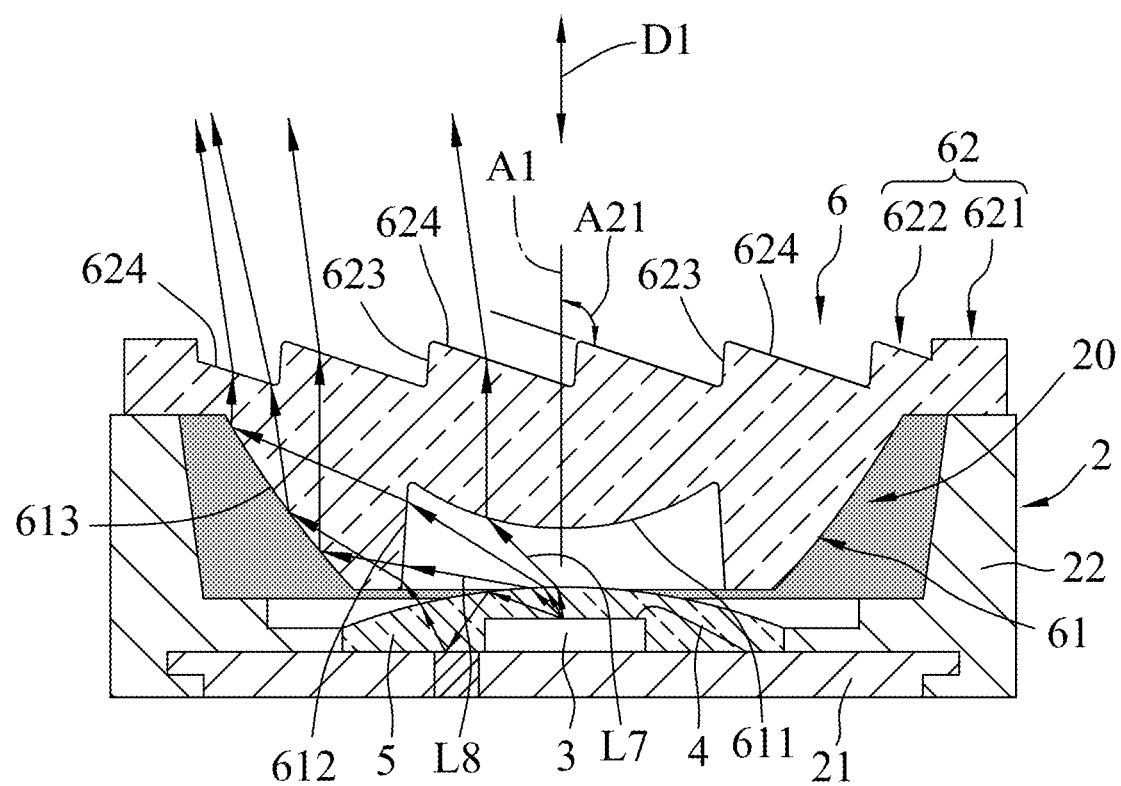
FIG. 7 is an incomplete section view, showing a second embodiment of the LED device according to the present invention.
Figure 8:
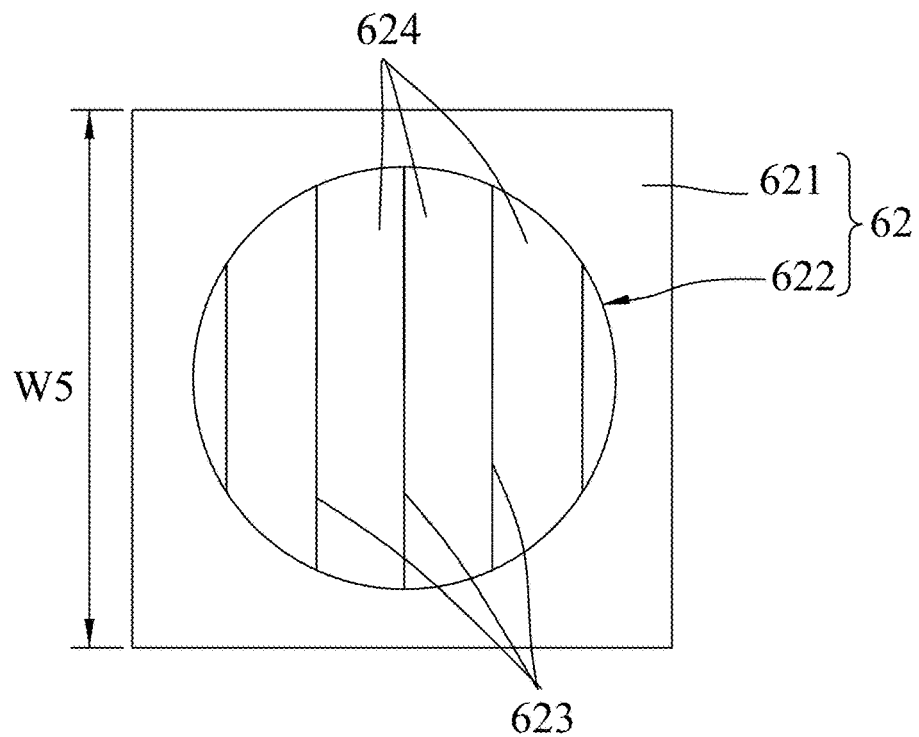
FIG. 8 is a top view, showing the second surface of the lens according to the second embodiment.
Figure 9:
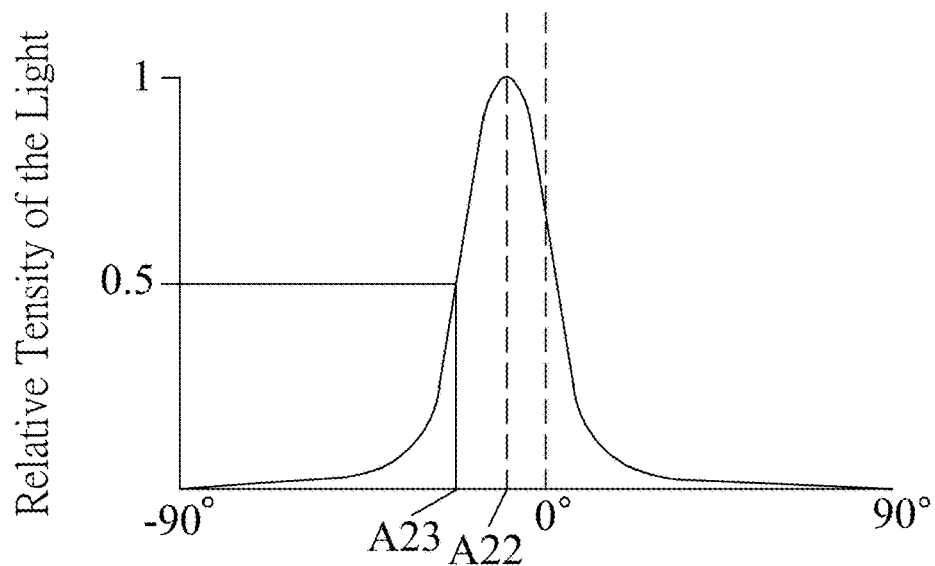
FIG. 9 is a graph illustrating the light moving in different directions in the second embodiment, relative intensity of the light, and the included angle between the light direction and the optical axis direction.

With reference to FIGS. 7 and 9, the LED device according to the second embodiment of the present invention is similar to that of the first embodiment, and the difference is that:

The second surface 62 has an encircling surface segment 621 with square exterior portion and round interior portion, and a circular surface segment 622 connected to the inner ring of the encircling surface segment 621. Face width W5 of the encircling surface segment 621 is 2.95 mm, which can be 2.5~4 mm or the diagonal width according to other embodiments of the present invention. The circular surface segment 622 has a plurality of straight surface portions 623 that extend straightly up and down at width direction and extend back and forth at length direction and a plurality of inclined surface portion 624 that extend obliquely up and down at width direction and extend back and forth at length direction. According to the first embodiment, each straight surface portion 623 is parallel with the optical axis direction D1, and therefore, the angle between each straight surface portion 623 and the optical axis direction D1 is 0°. Each inclined surface portion 624 is connected between two adjacent straight surface portions 623, and the obtuse angle A21 with the optical axis direction D1 is 110°. According to other embodiments of the present invention, each straight surface portion 623 and the optical axis direction D1 can form an acute angle ranging from 0° to 10°, and the obtuse angle A21 formed by each inclined surface portion 624 and the optical axis direction D1 can be 95°~145°. When the small-angle light L7 and the large-angle light L8 are emitted from each inclined surface portion 624, light direction is slightly deviated from the optical axis direction D1.

As mentioned before, the small-angle light L7 emits into the first subsurface 611 so that the light direction is deflected basically same as the optical axis direction D1, and then undergoes a second refraction when the light is emitted by one inclined surface portion 624 of the circular surface segment 622, and the light direction is slightly deflected from the optical axis direction D1. The large-angle light L8 is emitted by the second subsurface 612 and reflected by the third subsurface 613. The large-angle light is emitted by an inclined surface portion 624 of the circular surface segment 622 after the light direction is corrected towards the optical axis direction D1, and then slightly deviates towards the optical axis direction D1 again.

As shown in FIG. 9, as for the light provided in the second embodiment, the strong light angle A22 ($\theta_A$) is 8°, and the semi light angle A23 ($\theta_{1/2}$) is 17°, showing that the second embodiment can provide small light-emitting angle light. According to other embodiments, as the acute angle between each straight surface portion 623 and the optical axis direction D1 as well as the obtuse angle A21 between each inclined surface portion 624 and the optical axis direction D1 are different, the strong light angle A22 can be 3°~35°, and preferably 5°~15°, and the semi light angle A23 can be 8°~25°.

Figure 10:
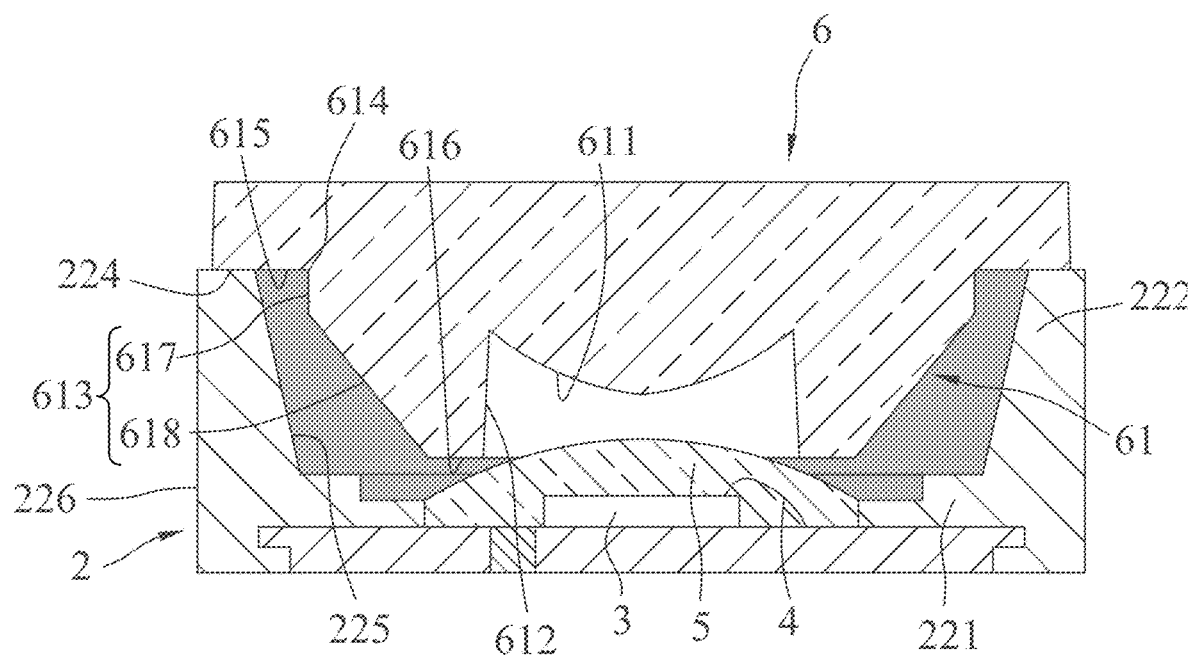
FIG. 10 is an incomplete section view, showing a third embodiment of the LED device according to the present invention.

With reference to FIG. 10, the LED device according to the third embodiment of the present invention is similar to the first embodiment, and the difference is that:

The third subsurface 613 also has a ring-shaped stretch-out surface portion 617 formed by straight-downward extension of the top ring edge 614, and a radial-shrinkage surface portion 618 formed by downward-extension of the stretch-out surface portion 617 with decreasing diameter.

The top surface roughness of the top surface 224 of the straight wall portion 222 is 5-7 μm, and the straight wall portion 222 and the encircling wall portion 221 directly form an inner surface 225. The straight wall portion 222 has an outer surface 226, where, the surface roughness of the inner surface 225 and the outer surface 226 is 3-5 μm, and the surface roughness of the inner surface 225 and the outer surface 226 is less than that of the top surface 224. Thanks to roughness design, the top surface 224, the inner surface 225 and the outer surface 226 can diffuse stray light that is not absorbed, which further decreases the intensity of the stray light at each direction and the optical interference from the third embodiment on other optical components. According to other embodiments of the present invention, the top surface roughness can be 3~15 μm, and the surface roughness can be 1~10 μm, which also reduce optical interference.

Figure 11:
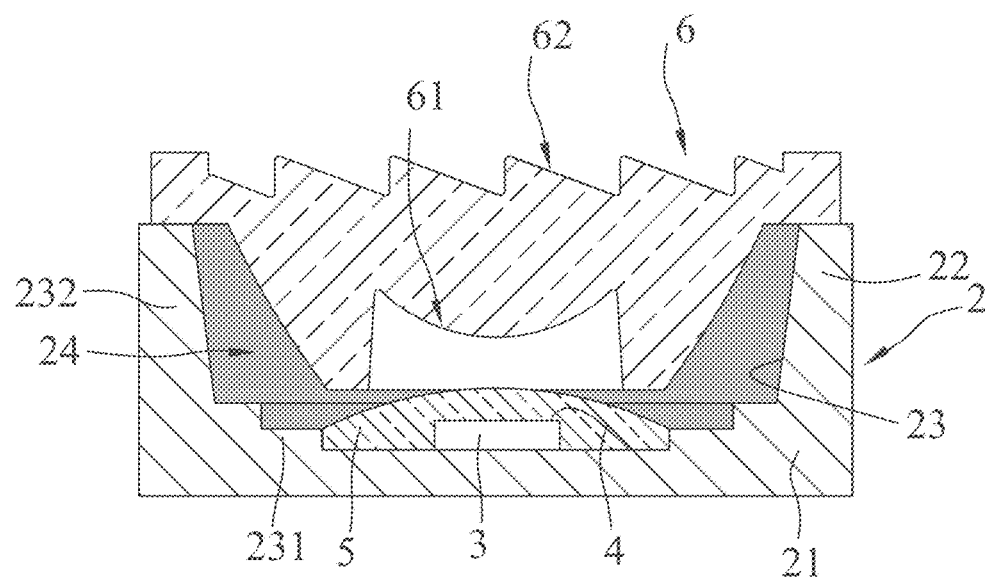
FIG. 11 is an incomplete section view, showing a fourth embodiment of the LED device according to the present invention.

With reference to FIG. 11, the LED device according to the fourth embodiment of the present invention is similar to the second embodiment, and the difference is that the base 21 and the encircling base portion 22 in the third embodiment are connected with all-in-one design.

Figure 12:
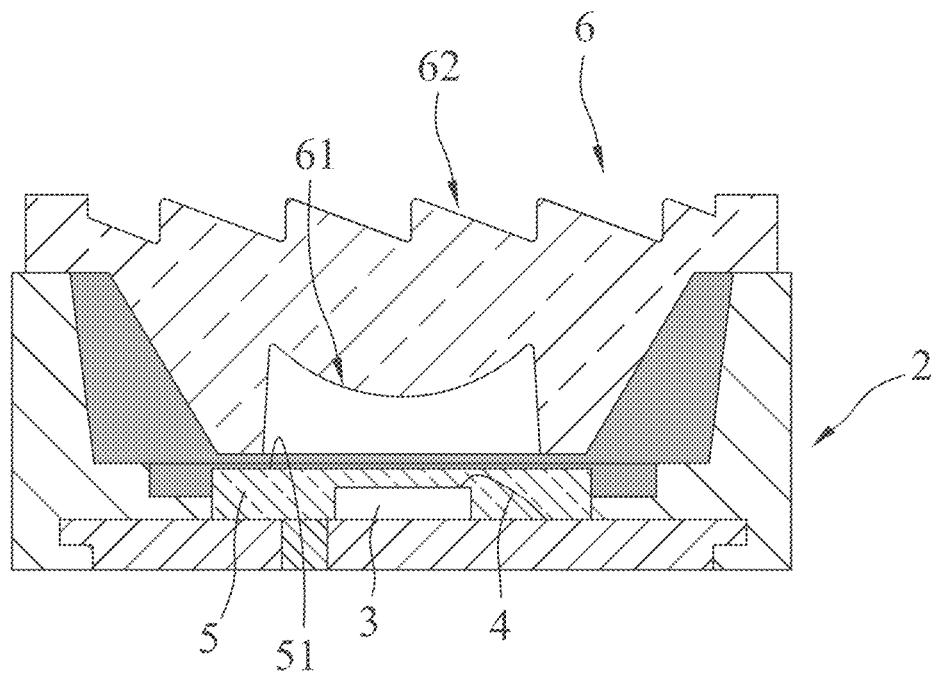
FIG. 12 is an incomplete section view, showing a fifth embodiment of the LED device according to the present invention.

With reference to FIG. 12, the LED device according to the fifth embodiment of the present invention is similar to the second embodiment, and the difference is that the upper surface 51 of the packaging adhesive 5 is in plane shape.

Figure 13:
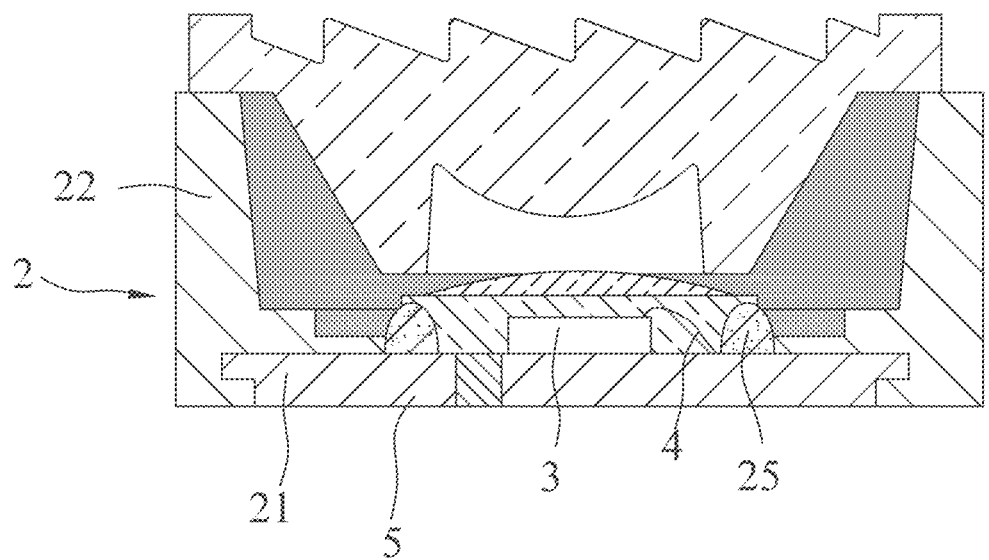
FIG. 13 is an incomplete section view, showing a sixth embodiment of the LED device according to the present invention.

With reference to FIG. 13, the LED device according to the sixth embodiment of the present invention is similar to the second embodiment, and the difference is that the encircling base portion 22 of the base (also referred to a base unit) 2 also comprises an encircling dam 25 that is arranged on the base 21 and surrounds the LED chip 3. The encircling dam 25 according to the sixth embodiment is ring-shaped. However, according to other embodiments, the encircling dam 25 can be semicircular ring, square ring or other shapes.

Various embodiments of the LED device disclosed herein can have one or more of the following advantages: light generated by the LED chip 3 is emitted from the second subsurface 612, and the third subsurface 613 can replace the reflective cavity for reflection, so that the LED device can provide small light-emitting angle light without using a special-structure reflective cavity, and is free of derivative problems due to the usage of the reflective cavity body. In addition, if the inner surface 225 and the outer surface 226 of the base 2 are light-absorbing surfaces, light-diffusing surfaces or their combination, the present invention is not likely to produce optical interference for other optical components.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:
1. A light-emitting diode (LED), comprising:
a base having an upward-opening accommodating space;
an LED chip disposed at the base, and arranged in the accommodating space;
a packaging adhesive covering the LED chip;
a lens disposed over the packaging adhesive,
wherein:
the lens has a first surface proximal to the packaging adhesive;
the first surface has:
a first subsurface at a center area with a substantially spherical or parabolic shape;
a second subsurface with a substantially ring shape and surrounding the first subsurface and extending downward with an increasing diameter;
a third subsurface with a substantially ring shape and surrounding the second subsurface, having a top ring edge and extending downward with a decreasing diameter;
a fourth subsurface with a substantially planar shape and surrounding the top ring edge of the third subsurface and connected with the base;
a fifth subsurface with a horizontal extension that connects to bottom ends of the second subsurface and the third subsurface; wherein a space is arranged between the fifth subsurface and the packaging adhesive to prevent the lens from contacting the packaging adhesive;
wherein the base comprises:
a bottom base portion configured to have the LED chip disposed thereon; and
an encircling base portion extending upwards along the bottom base portion higher than the LED chip and surrounding the LED chip;
the encircling base portion has an inner surface and an outer surface;

each of the inner surface and the outer surface is a light-absorbing surface, or a combination of light-absorbing surface and light-diffusing surface, with a light absorption rate not less than 70%;

the lens further has a second surface opposing the first surface;

the second surface comprises:
  a plurality of straight surface portions that extend straight up and down; and
  a plurality of inclined surface portions that extend obliquely up and down, wherein each inclined surface portion is connected between two adjacent straight surface portions;
    wherein the plurality of straight surface portions and the plurality of inclined surface portions form stepped structures configured to deviate light directions.

2. The LED device of claim 1, wherein the third subsurface further has:
  a stretch-out surface portion formed by a straight-downward extension of the top ring edge; and
  a radial-shrinkage surface portion formed by a downward-extension of the stretch-out surface portion with a decreasing diameter.

3. The LED device of claim 1, wherein a horizontal spacing between the top ring edge of the third subsurface and the base is more than 0 mm but not more than 0.3 mm.

4. The LED device of claim 1, wherein:
  the LED chip has a chip size;
  the first subsurface of the lens has an optical axis; and
  a spacing between the optical axis and the ring top edge of the third subsurface is about 1.6~3.4 times of the chip size.

5. The LED device of claim 1, wherein a maximum surface spacing between the upper top surface of the LED chip and the upper surface of the packaging adhesive is 0.1 mm 0.5 mm.

6. The LED device of claim 1, wherein the first subsurface and the packaging adhesive are separated up and down.

7. The LED device of claim 1, wherein:
  the LED chip has a chip size, and an upward or downward spacing between a horizontally-extending surface of the upper top surface of the LED chip and a top surface of the encircling base portion is at least 0.7 times the chip size.

8. The LED device of claim 1, wherein the first subsurface and the second subsurface are light emitting surfaces and the third subsurface is a light reflective surface.

9. The LED device of claim 1, wherein:
  a refractive index of the LED chip is 1.6-4;
  a refractive index of the packaging adhesive is 1.3-1.6; and
  a refractive index of the lens is 1.3-1.7.

* * * * *